(12) United States Patent
Shin et al.

(10) Patent No.: US 10,529,287 B2
(45) Date of Patent: Jan. 7, 2020

(54) DISPLAY DEVICE AND CONTROL METHOD FOR THE SAME

(71) Applicant: LG DISPLAY CO., LTD., Seoul (KR)

(72) Inventors: SunKyung Shin, Gyeonggi-do (KR); Beom-Jin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 31 days.

(21) Appl. No.: 16/047,730

(22) Filed: Jul. 27, 2018

(65) Prior Publication Data

US 2019/0051253 A1 Feb. 14, 2019

(30) Foreign Application Priority Data

Aug. 9, 2017 (KR) .................. 10-2017-0101277

(51) Int. Cl.
| | |
|---|---|
| *G09G 3/3291* | (2016.01) |
| *H01L 51/52* | (2006.01) |
| *G09G 3/3233* | (2016.01) |
| *H01L 27/32* | (2006.01) |
| *G06F 3/01* | (2006.01) |
| *G06F 1/3218* | (2019.01) |
| *G06F 1/16* | (2006.01) |

(Continued)

(52) U.S. Cl.
CPC ........... *G09G 3/3291* (2013.01); *G06F 1/163* (2013.01); *G06F 1/3218* (2013.01); *G06F 1/3265* (2013.01); *G06F 3/011* (2013.01); *G09G 3/3233* (2013.01); *H01L 27/3276* (2013.01); *H01L 51/5275* (2013.01); *G02B 27/017* (2013.01); *G02B 2027/0178* (2013.01); *G09G 3/003* (2013.01); *G09G 3/36* (2013.01); *G09G 2300/0426* (2013.01); *G09G 2320/029* (2013.01); *G09G 2320/0626* (2013.01); *G09G 2330/021* (2013.01); *G09G 2360/16* (2013.01)

(58) Field of Classification Search
CPC .............. G09G 3/3291; G09G 3/3233; G09G 2300/0426; G09G 2320/029; G09G 3/003; G09G 2320/0626; G09G 3/36; G09G 2330/021; G09G 2360/16; G09G 3/20; G06F 1/3265; G06F 1/163; G06F 1/3218; G06F 3/011; H01L 27/3276; H01L 51/5275; G02B 27/017; G02B 2027/0178
See application file for complete search history.

(56) References Cited

U.S. PATENT DOCUMENTS

2011/0249195 A1* 10/2011 Teranuma ............. G06F 1/3203
348/730

* cited by examiner

*Primary Examiner* — Mark W Regn
(74) *Attorney, Agent, or Firm* — Birch, Stewart, Kolasch & Birch, LLP

(57) ABSTRACT

A display device and a method of controlling the display device are discussed. The display device includes a first display configured to display a first line at a first time and configured to display a second line at a second time at a position spaced a predetermined distance apart from the position at which the first line is displayed, a second display configured to display the second line at the first time and configured to display the first line at the second time, a first driver IC configured to drive the first display, a second driver IC configured to drive the second display, and a controller configured to transmit, to the first driver IC, information on the first line at the first time and information on the second line at the second time and configured to supply, to the second driver IC, information on the second line at the first time and information on the first line at the second time.

20 Claims, 13 Drawing Sheets

(51) Int. Cl.
*G06F 1/3234* (2019.01)
*G02B 27/01* (2006.01)
*G09G 3/36* (2006.01)
*G09G 3/00* (2006.01)

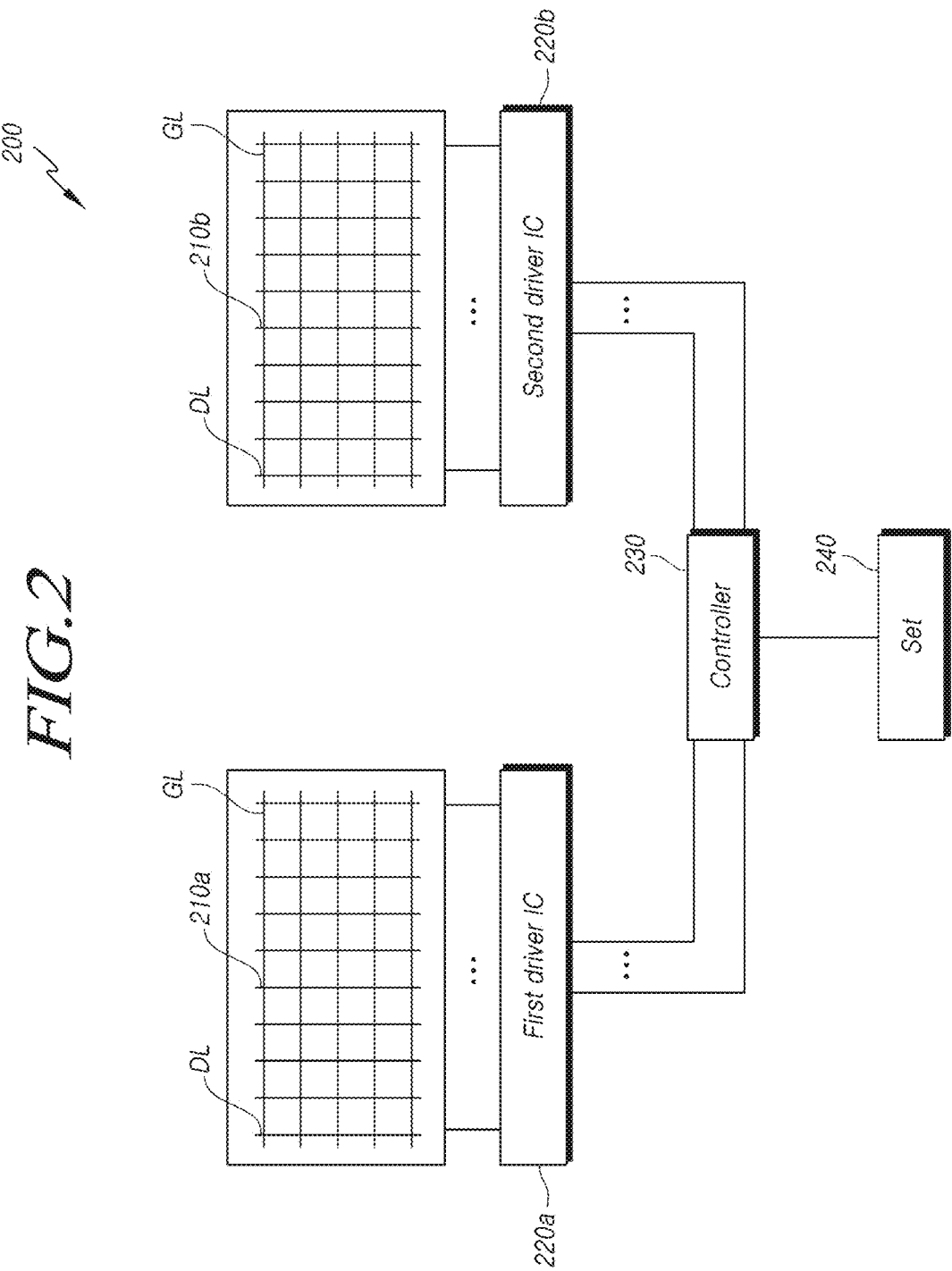

FIG.3A
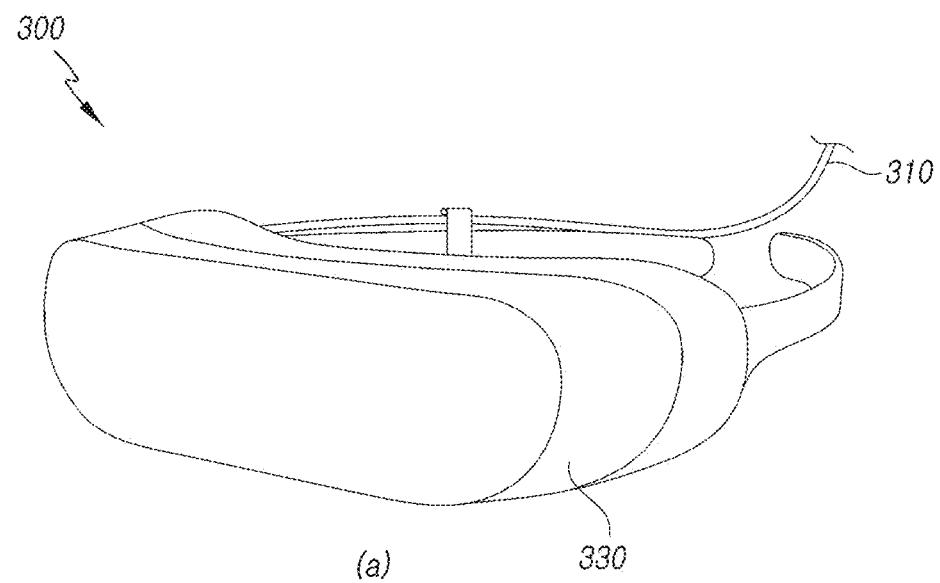
(a)
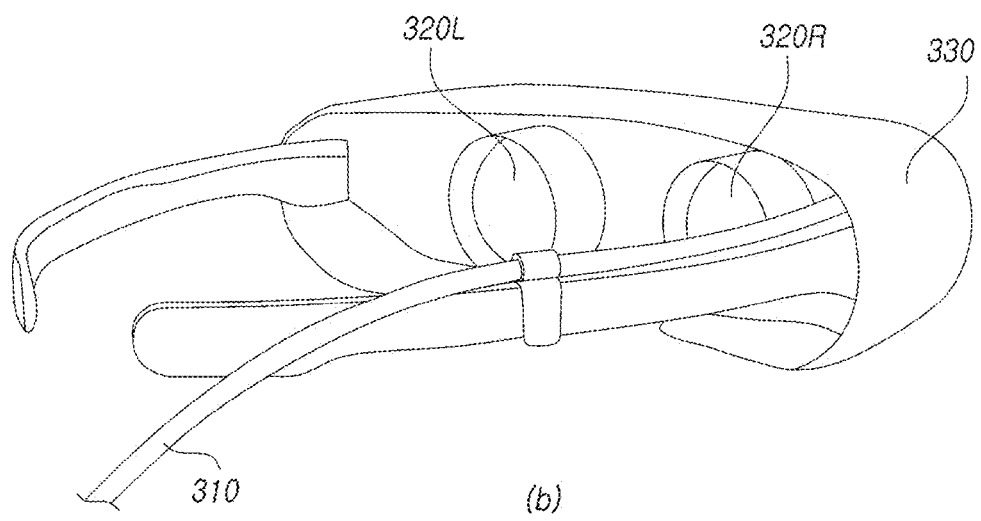
(b)

DISPLAY DEVICE AND CONTROL METHOD FOR THE SAME

CROSS REFERENCE TO RELATED APPLICATION

This application claims priority to Korean Patent Application No. 10-2017-0101277, filed in the Republic of Korea on Aug. 9, 2017, which is hereby incorporated by reference for all purposes as if fully set forth herein.

BACKGROUND OF THE INVENTION

1. Field of the Invention

The present embodiments relate to a display device and a control method for the same.

2. Description of the Related Art

The advent of an information society has led to a variety of demands for display devices for displaying images, and various types of flat panel display devices, such as a Liquid Crystal Display Device (LCD), a Plasma Display Device, an Organic Light-Emitting Display Device (OLED), and the like, have been developed.

In recent years, the flat panel display devices have gradually become thinner for aesthetics or convenience of use, and the contrast ratio thereof has increased to improve visibility.

In addition, if the display device is made thinner, it can be easily employed in smart glasses. Smart glasses are configured in the form of a wearable device, and various applications thereof have been developed and used. Further, smart glasses can include a plurality of sensors, and can perform various functions. Therefore, smart glasses have high power consumption. Smart glasses can be supplied with power through a battery. However, smart glasses can require frequent charging because of the high power consumption thereof, which makes it tiresome to use the same. Further, when a battery having a large capacity is adopted in order to reduce the frequency of charging, it can cause a problem in that the device becomes heavy and bulky.

Therefore, a display device adopted in such smart glasses is required to reduce the power consumption due to the problem of the battery capacity and the like, in order to enhance the convenience of use.

SUMMARY OF THE INVENTION

An aspect of the present embodiments of the invention is to provide a display device for increasing a usage time and for enhancing the convenience of use and a control method thereof.

Another aspect of the present embodiments is to provide a display device that can be applied to devices used for virtual reality/augmented reality and a control method thereof.

The present embodiments according to one aspect provide a display device including a first display configured to display a first line at a first time and configured to display a second line at a second time at a position spaced a predetermined distance apart from the position at which the first line is displayed, a second display configured to display the second line at the first time and configured to display the first line at the second time, a first driver IC configured to drive the first display, a second driver IC configured to drive the second display, and a controller configured to transmit, to the first driver IC, information on the first line at the first time and information on the second line at the second time and configured to supply, to the second driver IC, information on the second line at the first time and information on the first line at the second time.

The present embodiments according to another aspect provide a display device including a first display configured to include N first pixel row blocks where N is a natural number equal to or greater than 2, a second display configured to include N second pixel row blocks, a first driver IC configured to drive the first display, and a second driver IC configured to drive the second display, wherein, during the ith frame time, K first pixel row blocks (where K is a natural number equal to or greater than 1 and less than N), among the N first pixel row blocks, are driven in the first display, and K second pixel row blocks, among the N second pixel row blocks, are driven in the second display, and wherein, during the (i+1)th frame time, K first pixel row blocks, among (N−K) first pixel row blocks excluding K first pixel row blocks that have been driven during the ith frame time, among the N first pixel row blocks, are driven in the first display, and K second pixel row blocks, among (N−K) second pixel row blocks excluding K second pixel row blocks that have been driven during the ith frame time, among the N second pixel row blocks, are driven in the second display.

The present embodiments according to another aspect provide a controller for controlling a first display corresponding to a left eye of a user and a second display corresponding to a right eye of a user, which includes an operator configured to transmit, to a first driver IC for driving the first display, information on a first line at a first time and information on a second line, spaced a predetermined distance apart from the first line, at a second time, and configured to transmit, to a second driver IC for driving the second display, information on the second line at the first time and information on the first line at the second time, and a memory configured to store the information on the first line and the information on the second line.

The present embodiments according to another aspect provide a method for controlling a display device including a first display and a second display, which includes displaying a first line on the first display and displaying a second line at a position spaced a predetermined distance apart from the position at which the first line is displayed on the second display at a first time, and displaying the second line on the first display and displaying the first line on the second display at a second time.

According to the present embodiments, it is possible to provide a display device capable of increasing a usage time and enhancing the convenience of use and a control method thereof.

According to the present embodiments, it is also possible to provide a display device that can be applied to devices used for virtual reality/augmented reality and a control method thereof.

BRIEF DESCRIPTION OF THE DRAWINGS

The above and other aspects, features, and advantages of the present disclosure will be more apparent from the following detailed description taken in conjunction with the accompanying drawings, in which:

FIG. 2 is a structural view illustrating a second embodiment of the display device according to the present invention;

FIG. 3A is a conceptual diagram illustrating an example of a pair of smart glasses adopting the display device shown in FIG. 1;

DETAILED DESCRIPTION OF THE EMBODIMENTS

Figure 1:
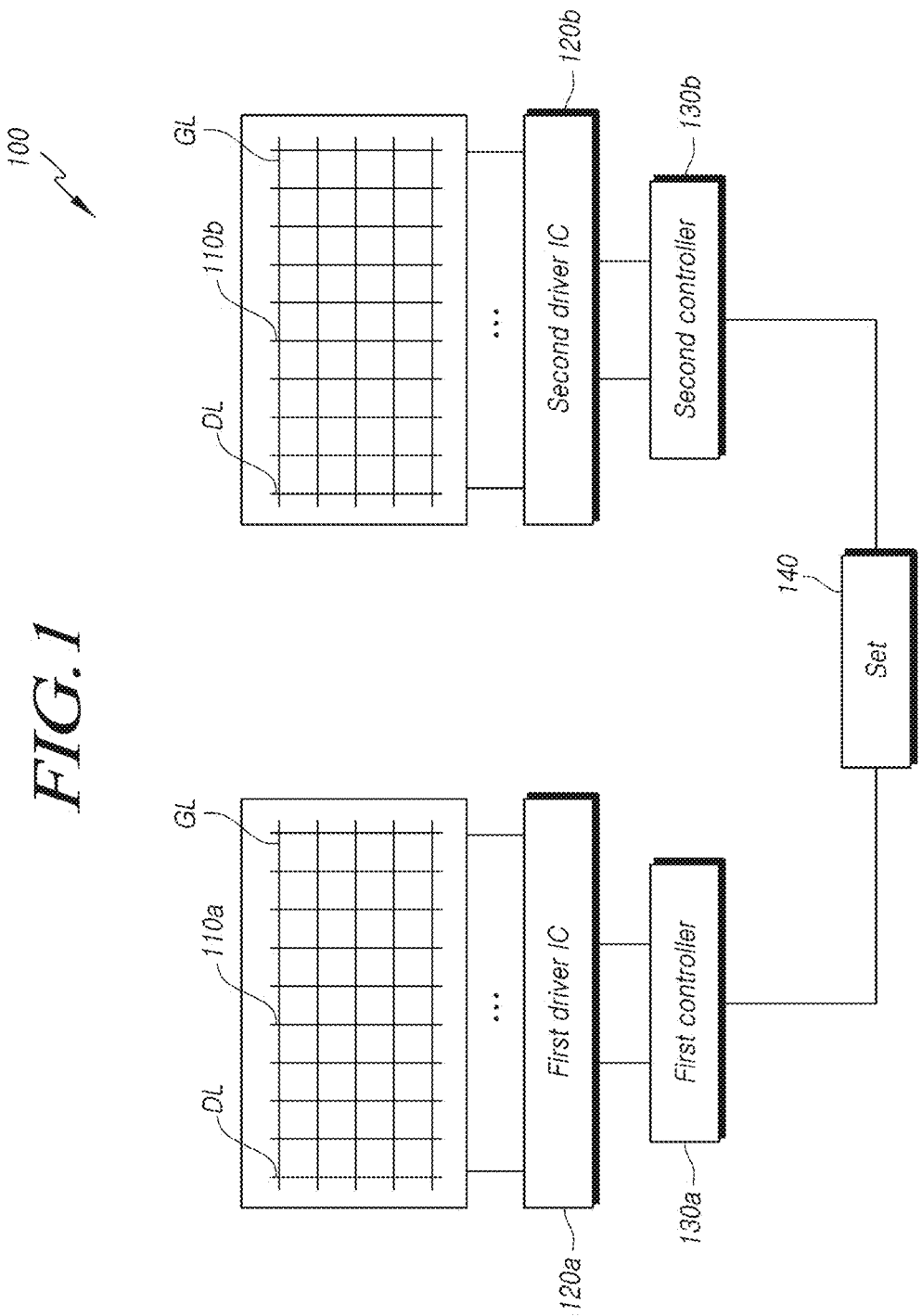
FIG. 1 is a structural diagram illustrating a first embodiment of a display device according to the present invention.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it can make the subject matter of the present disclosure rather unclear.

In addition, terms, such as first, second, A, B, (a), (b) or the like can be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element can "be connected to", "be coupled to", or "be in contact with" the structural elements as well as that the certain structural element is directly connected to or is in direct contact with another structural element.

FIG. 1 is a structural diagram illustrating a first embodiment of a display device according to the present invention.

All the components of the display device according to all embodiments of the present invention are operatively coupled and configured.

Referring to FIG. 1, a display device 100 can include a first display 110a, a second display 110b, a first driver IC 120a, a second driver IC 120b, a first controller 130a, and a second controller 130b.

The first display 110a and the second display 110b can have a plurality of data lines (DL) and a plurality of gate lines (GL), which intersect each other, and pixels, which are formed at intersections of the plurality of data lines (DL) and the plurality of gate lines (GL). Each pixel can include sub-pixels for displaying any color among red, green, blue, or white. The pixel can include a pixel circuit that generates a driving current and an organic light-emitting diode that emits light through the flow of driving current. The plurality of data lines (DL) and the plurality of gate lines (GL) can provide data signals and gate signals, respectively, so that the driving current corresponding to the data signal can flow through the pixels. The disposition of lines in the first display 110a and the second display 110b is not limiting.

The first display 110a can display a first line at a first time, and can display a second line at a position that is spaced a predetermined distance apart from the position at which the first line is displayed at a second time. Alternatively, the second display 110b can display the second line at the first time, and can display the first line at the second time. In addition, the first display 110a can correspond to a user's left eye, and the second display 110b can correspond to a user's right eye. However, the present disclosure is not limited thereto.

The first line or the second line can be lines that are displayed on the first display 110a or the second display 110b due to the fact that the pixels thereof do not emit light. In addition, the first line and the second line can be displayed in black because the pixels do not emit light. Black data can be input to the first line and the second line in order to display the first line or the second line in black. However, the present disclosure is not limited thereto, and the first line and the second line can be lines that are displayed on the first display 110a and the second display 110b, respectively, by means of corresponding pixels that emit light at a low grayscale level. In addition, the first line and the second line can be lines that do not emit light because the gate signals are not driven.

In the case where the display device 100 is an organic light-emitting display device, light is emitted in response to the flow of a driving current. Thus, if a portion of the device does not emit light, power consumption can be reduced accordingly. Therefore, when the first line and the second line, which do not emit light, are provided on the first display 110a and the second display 110b, respectively, the power consumption can be reduced. In the case where the display device 100 is a liquid crystal display device using a direct-type backlight, if backlights at the positions corresponding to the first line and the second line do not emit light, the power consumption can be reduced. This can be the same in the case where the pixels at the positions corresponding to the first line and the second line emit light at a low grayscale level. Furthermore, the first line and the second line can be lines having a predetermined thickness, which are displayed by the pixels that do not emit light. Since the images displayed on the first display 110a and the second display 110b are simultaneously recognized by the left eye and the right eye of a user, the user can not perceive the first line and the second line.

The display device can display images including a plurality of frames, wherein a first time can be a period in which odd-numbered frames are displayed and a second time can be a period in which even-numbered frames are displayed. However, the present disclosure is not limited thereto.

The first driver IC 120a can apply data signals and gate signals to the first display 110a, and the second driver IC 120b can apply data signals and gate signals to the second display 110b. The first driver IC 120a and the second driver IC 120b can sense deterioration information on the pixels included in the first display 110a and the second display 110b, respectively. Each of the first driver IC 120a and the second driver IC 120b can include a data driver that is connected to the data lines (DL) and applies data signals and a gate driver that is connected to the gate lines (GL) and applies gate signals. The gate driver can include a gate-in-panel (GIP) circuit provided on the display and connected to the gate lines (GL). The first driver IC 120a and the second driver IC 120b can be disposed on a piece of glass or a film so as to be connected to the first display 110a and the second display 110b in a chip-on-glass (COG) or chip-on-film (COF) form.

The first controller 130a and the second controller 130b can control the first driver IC 120a and the second driver IC 120b, respectively. The first controller 130a and the second controller 130b can receive a control signal and an image signal (RGB) from a set 140, respectively. The first controller 130a and the second controller 130b can perform control such that the first display 110a and the second display 110b select one of a first driving mode and a second driving mode and operate according thereto, respectively. The first driving mode can be a normal mode in which lines are not displayed on the first display 110a and the second display 110b, and the second driving mode can be a power consumption reduction mode in which lines are displayed on the first display 110a and the second display 110b.

The first controller 130a and the second controller 130b can select one of either the first driving mode or the second driving mode in response to received image signals, respectively. The first controller 130a and the second controller 130b can select one of the first driving mode and the second driving mode using an average picture level (APL) corresponding to the average brightness value of the image signal for one frame. When the second driving mode is selected, the first controller 130a and the second controller 130b can perform control such that black data is supplied to one of either the first display 110a or the second display 110b. In addition, when the second driving mode is selected, the first controller 130a and the second controller 130b can perform control such that the first line and the second line, which are displayed on one of either the first display 110a or the second display 110b, are lines that do not emit light because the gate signals are not applied. When the brightness of the displayed frame is equal to or greater than a predetermined value, the first controller 130a and the second controller 130b can select the second driving mode, and can display the lines, thereby reducing the power consumption.

In addition, the first controller 130a and the second controller 130b can receive a synchronizing signal from the set 140, respectively, thereby synchronizing the images displayed on the first display 110a and the second display 110b.

FIG. 2 is a structural view illustrating a second embodiment of a display device according to the present invention.

A display device 200 shown in FIG. 2 is different from the display device 100 shown in FIG. 1 in that a first display 210a and a second display 210b are controlled by a single controller 230. Since the single controller 230 controls both the first driver IC 220a and the second driver IC 220b, the first driver IC 220a and the second driver IC 220b are not required to be synchronized, and thus wiring between a set 240 and the controller 230 can be simpler than the display device 100 shown in FIG. 1.

FIG. 3A is a conceptual diagram illustrating an embodiment of a virtual reality (VR) device adopting the display device shown in FIG. 1.

Referring to FIG. 3A, (a) is a perspective view of a VR device 300 when viewed from the front, and (b) is a perspective view of the VR device when viewed from the rear. The VR device 300 can include a first lens 320R and a second lens 320L corresponding to the right eye and the left eye of a user, respectively. The first display 110a can be disposed on the first lens 320R, and the second display 110b can be disposed on the second lens 320L. The first driver IC 120a can be disposed on the first lens 320R, and the second driver IC 120b can be disposed on the second lens 320L. The first controller 130a and the second controller 130b can be disposed on the first lens 320R and the second lens 320L, respectively. A cable 310 can be provided to be connected to the frame of the smart glass and to receive signals including a synchronization signal and an image signal from an external set. In addition, the synchronization signal and the image signal can be supplied to the first controller 130a and the second controller 130b, which are disposed on the first lens 320R and the second lens 320L. A cover 330 can be provided to prevent external light from being radiated to the first lens 320R and the second lens 320L.

Although the display device 100 shown in FIG. 1 has been described here as being applied to the VR device 300, it can be seen that the display device 200 shown in FIG. 2 can be applied as well.

The VR device 300 can be used as a device used for virtual reality (VR) because light cannot pass through the lenses and images are displayed on surfaces facing the user's eyes. However, the present disclosure is not limited thereto, and the VR device 300 can be used as a device used for augmented reality (AR) by displaying images while allowing the lenses to transmit some light. In addition, when the VR device 300 is used for augmented reality, a camera can be installed in the VR device 300, and the camera can synthesize an image obtained by photographing a background corresponding to the front of the VR device 300 and a pre-stored image, thereby enabling the user to experience augmented reality. However, the function of the VR device 300 is not limited thereto.

Figure 3B:
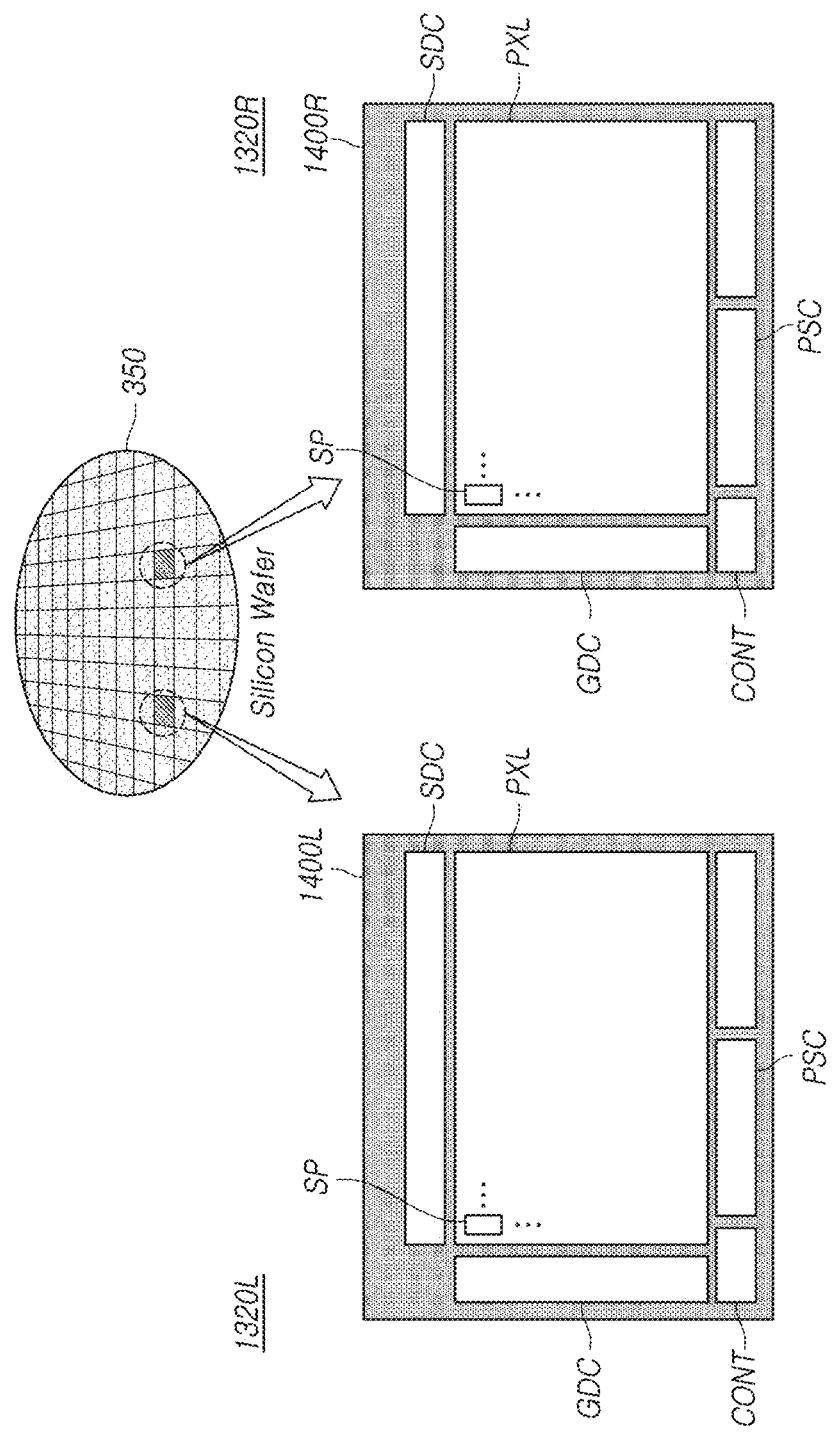
FIG. 3B is a view illustrating a display device and a silicon wafer according to an embodiment of the present invention.

FIG. 3B is a view illustrating a display device and a silicon wafer according to the present embodiments.

Referring to FIG. 3B, a plurality of micro-display devices 1320R and 1320L can be made on a silicon wafer 350. The micro-display devices 320R and 320L made on the silicon wafer 350 can be all or some of the display device. In this regard, all or some of the micro-display devices 1320R and 1320L can be a kind of integrated circuit manufactured through a silicon wafer fabrication process (semiconductor process).

Therefore, all or some of the micro-display devices 1320R and 1320L, according to the present embodiments, can be referred to as "display integrated circuits".

For example, a plurality of micro-display devices 1320R and 1320L can be formed on the silicon wafer 350 according to the present embodiments. There can be provided a plurality of sub-pixels (SP) arranged on a pixel array region (PXL) of the silicon substrate 1400R or 1400L and a gate driving circuit (GDC) and a source driver IC (SDC) for driving the pixel array region (PXL), which are positioned on the silicon substrate 10 on the periphery of the pixel array region (PXL). A controller (CONT) for driving the gate driving circuit (GDC) and the source driving circuit (SDC) can be further provided. In addition, a power supply circuit (PCS) for supplying power can be further included. However, the circuits disposed on the silicon substrate are not limited thereto.

As described above, since all or some of the micro-display devices 1320R and 1320L, according to the present embodiments, are manufactured through a silicon wafer manufacturing process, it is possible to precisely, easily, and conveniently manufacture the same.

The micro-display devices 1320R and 1320L, according to the present embodiments, can be Organic Light-Emitting Diode (OLED) displays, or can be other types of displays such as Liquid Crystal Displays (LCD).

In addition, the micro-display devices 1320R and 1320L can be formed on the whole or some of the first lens 320R and second lens 320L of the VR device 300 shown in FIG. 3A.

Figure 4:
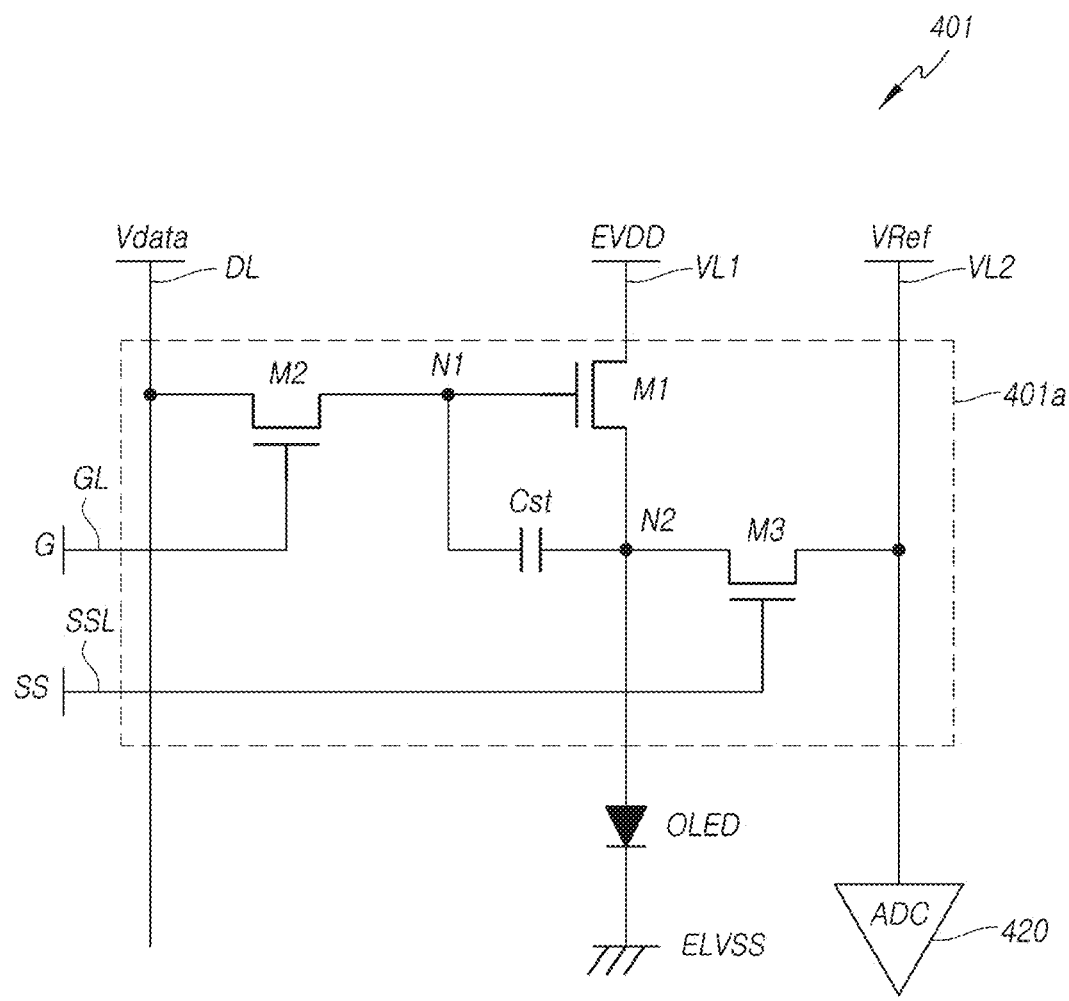
FIG. 4 is a circuit diagram illustrating an example of a pixel employed in a display according to the present embodiments.

FIG. 4 is a circuit diagram illustrating an example of a pixel employed in a display according to the present embodiments. The pixel of FIG. 4 can be used in any one of the displays described according to the embodiments of the present invention.

Referring to FIG. 4, a pixel 401 can include an organic light-emitting diode (OLED) and a pixel circuit 401a.

The organic light-emitting diode (OLED) can be supplied with a driving current corresponding to the voltage of an anode electrode and the voltage of a cathode electrode, thereby emitting light. The organic light-emitting diode (OLED) can include an organic film, and can emit red, green, blue, and/or white light by means of the organic film.

The pixel circuit 401a can transmit a driving current to the organic light-emitting diode (OLED). The pixel circuit 401a can include a first transistor (M1), a second transistor (M2), a third transistor (M3), and a capacitor (Cst). The first transistor (M1) can be a driving transistor for generating a driving signal in response to a data signal. The second transistor (M2) and the third transistor (M3) can be switching transistors. The pixel circuit 401a shown here is only an example and is not limited thereto.

The first transistor (M1) can have a first electrode connected to a first power supply line (VL1), a second electrode connected to a second node N2, and a gate electrode connected to a first node (N1). The second node N2 can be connected to an anode electrode of the organic light-emitting diode (OLED). Driving current can flow in the direction from the first electrode to the second electrode in response to the voltage applied to the first node (N1).

The second transistor (M2) can have a first electrode connected to a data line (DL), a second electrode connected to a first node (N1), and a gate electrode connected to a gate line (GL). The data voltage transmitted through the data line (DL) can be transmitted to the first node (N1) in response to the gate signal transmitted through the gate line (GL).

The third transistor (M3) can have a first electrode connected to the second power supply line (VL2), a second electrode connected to the second node (N2), and a gate electrode connected to a sensing control signal line (SSL). The third transistor (M3) can transmit, to an ADC 420 connected to the second power supply line (VL2), information on the driving current flowing through the organic light-emitting diode (OLED) and information on the driving voltage applied to the organic light-emitting diode (OLED) in response to a sensing control signal transmitted through the sensing control signal line (SSn). The ADC 420 can be included in the first driver IC 120a and the second driver IC 120b shown in FIG. 1.

The capacitor (Cst) can be disposed between the first node (N1) and the second node (N2), and can maintain the voltage of the first node (N1) to correspond to the voltage stored in the capacitor (Cst).

In the pixel 401 as configured above, during a sensing period, a sensing signal can be transmitted through the data line (DL), and the magnitude of a sensing current flowing through the driving transistor and the voltage applied to the organic light-emitting diode (OLED) can be transmitted to the ADC 420 through the second power supply line by the sensing signal. During a display period, a data signal (Vdata) can be transmitted through the data line (DL), and the organic light-emitting diode (OLED) can emit light to correspond to the driving current flowing according to the data signal (Vdata), thereby displaying an image.

Figure 5:
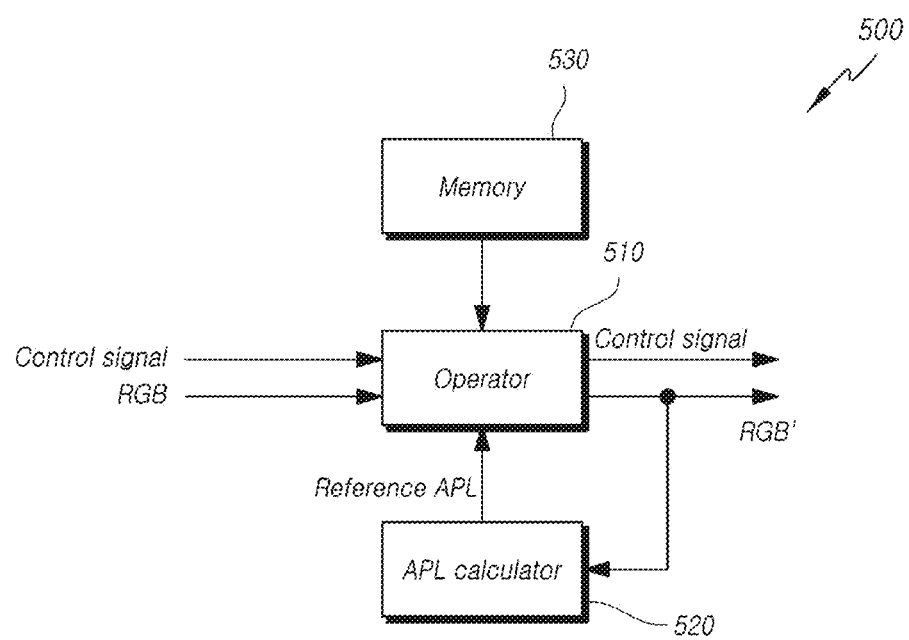
FIG. 5 is a structural diagram illustrating an example of a first controller employed in the present embodiments.

FIG. 5 is a structural diagram illustrating an example of a first controller employed in the present embodiments. The first controller of FIG. 5 can be used as any one of the first controller described according to the embodiments of the present invention.

Referring to FIG. 5, a first controller 500 can include an operator 510, an APL calculator 520, and a memory 530.

The operator 510 can receive a control signal and an image signal (RGB), and can output a control signal and a corrected image signal (RGB'). The corrected image signal (RGB') can be an image signal that has been corrected to correspond to deterioration information on the pixel. The operator 510 can select one of a first driving mode and a second driving mode. The operator 510 can allow the first display 110a to display the first line at a first time and the second line at a second time in the second driving mode.

The operator 510 can receive a reference APL, and can select one of the first driving mode and the second driving mode. The operator 510 can determine that a mean value of brightness of an image is higher than a predetermined value to correspond to a reference APL, and can select the second driving mode, thereby reducing power consumption. However, the method of selecting the driving mode is not limited thereto.

The APL calculator 520 can calculate a reference APL, and can transmit the same to the operator 510. The APL calculator 520 can calculate a reference APL using the corrected image signal (RGB') output from the operator 510. Accordingly, the APL calculator 520 can calculate a reference APL using the corrected image signal displayed on the first display 110a. The brightness of the displayed image can be recognized using the reference APL, and power consumption can be reduced according to the brightness.

The memory 530 can include position information on the first line and the second line displayed on the first display 110a shown in FIG. 1. The operator 510 can obtain position information on the first line and the second line using the position information stored in the memory 530, and can output a control signal corresponding thereto, thereby displaying the first line and the second line. The first line and the second line can be displayed by inputting a data signal for displaying the first line and the second line to correspond to the position information, or can be displayed by stopping driving of gate lines corresponding to the first line and the second line. The data signal for displaying the first line and the second line can be black data. However, the data signal is not limited thereto.

Although the first controller 500 has been described here, the second controller shown in FIG. 1 can also be implemented in the same or similar manner. In addition, the first controller and the second controller can receive a synchronization signal to thus output a signal corresponding to the synchronization signal such that images displayed on the first display and the second display can be synchronized with each other. The synchronization signal can include a start pulse, a vertical synchronization signal, and a horizontal synchronization signal. The synchronization signal can further include a clock.

Figure 6:
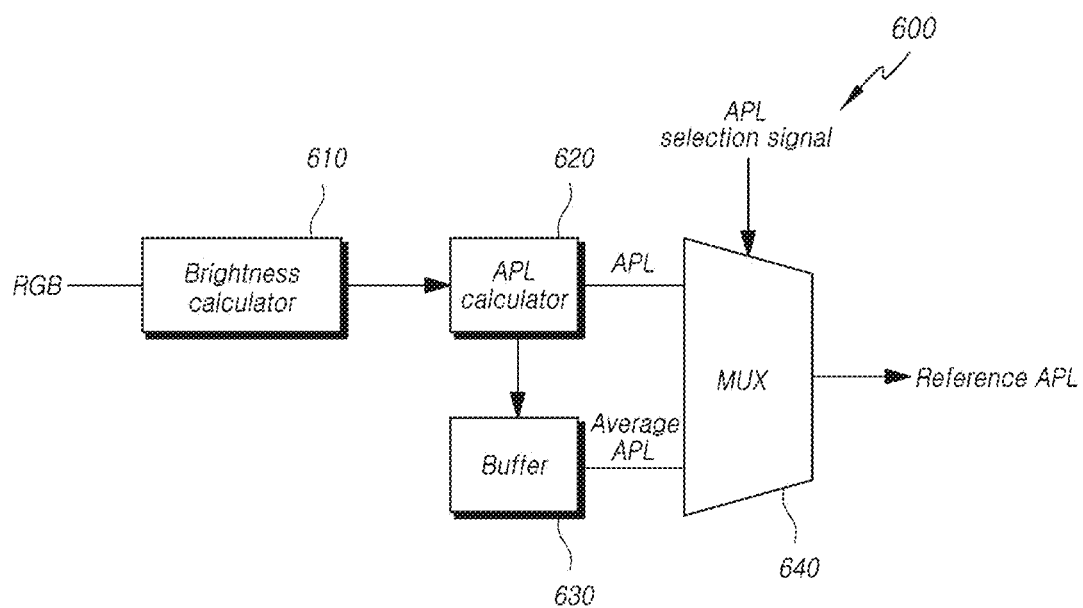
FIG. 6 is a structural diagram illustrating an example of an average picture level (APL) calculator employed in the present embodiments.

FIG. 6 is a structural diagram illustrating an example of an APL calculator employed in the present embodiments. The APL calculator of FIG. 6 can be used as any one of the APL calculator described according to the embodiments of the present invention.

Referring to FIG. 6, the APL calculator 600 can include a brightness calculator 610, an APL calculator 620, and a buffer 630.

The brightness calculator 610 can separate brightness information, blue color difference information, and red color difference information from an image signal of red, blue, and green by applying Equation 1 below. In addition, the brightness calculator 610 can output brightness information.

$$Y = 0.29900R + 0.58700G + 0.11400B$$

$$Cb = -0.16874R - 0.33126G + 0.50000B$$

$$Cr = 0.50000R - 0.41869G - 0.08131B \qquad \text{[Equation 1]}$$

Here, Y is brightness information, Cb is blue color difference information, and Cr is red color difference information.

The brightness calculator 610 can transmit the calculated brightness information to the APL calculator 620, and the APL calculator 620 can calculate an APL for each frame. The APL calculator 620 can store the calculated APL in the buffer 630. The buffer 630 can receive and store the APLs corresponding to at least two frames. The APL calculator 620 can also calculate an average APL using at least two corresponding APLs stored in the buffer 630, and can store the same in the buffer 630. The buffer 630 can output the stored average APL. The buffer 630 can be a memory.

The APL calculator 600 can include a MUX 640 for selecting one of the APL output from the APL calculator 620 and the average APL output from the buffer 630 and for outputting the same to the operator 510 shown in FIG. 5. The MUX 640 can receive an APL selection signal, and can output one of either the APL or the average APL. In the case where the reference APL is an APL that changes for each frame, which is calculated in the APL calculator, the brightness can be adjusted in frame units, so that the power consumption can be reduced more efficiently. However, in the case of an image having large variation in the APL, the brightness difference between the frames can increase. In the case where the reference APL is the average APL, the brightness is not adjusted in frame units, so that the reduction of power consumption can not be efficiently performed. However, even in the case of large variation in the APL, the brightness difference between the frames can not be significant.

Figure 7:
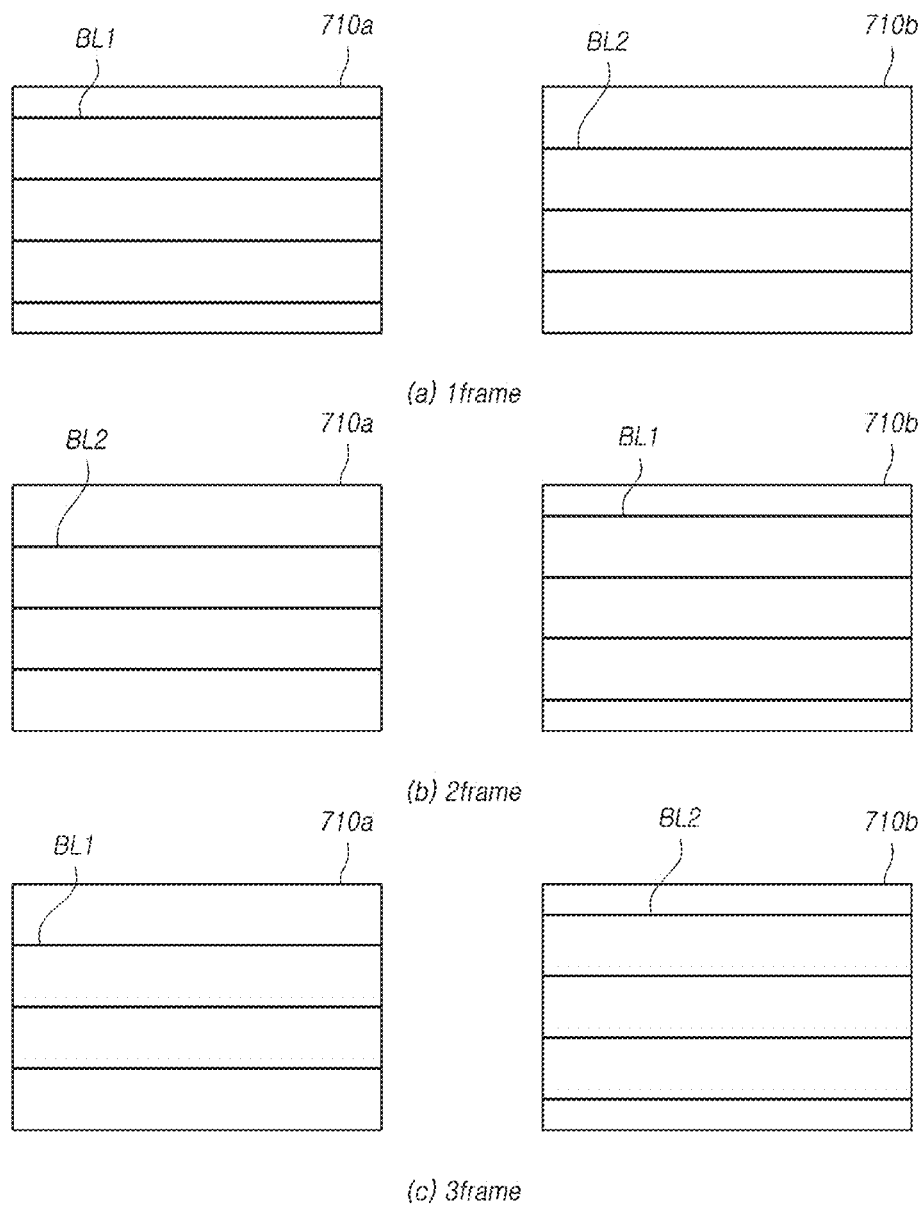
FIG. 7 is a conceptual diagram illustrating an example of a first line and a second line displayed to correspond to time on a first display and a second display employed in the present embodiments.

FIG. 7 is a conceptual diagram illustrating an embodiment of a first line and a second line displayed to correspond to time on a first display and a second display employed in the present invention.

Referring to FIG. 7, (a) shows a first display 710*a* and a second display 710*b* in which a first frame is displayed. The first lines (BL1) can be displayed on the first display 710*a* and the second lines (BL2) can be displayed on the second display 710*b* in the first frame. When the first display 710*a* and the second display 710*b* are superimposed, the second lines (BL2) can be disposed between the first lines (BL1). Here, "superimposition" can preferably means virtual overlapping of the first display 710*a* and the second display 710*b*, instead of physical overlapping thereof. In addition, when the first display 710*a* and the second display 710*b* correspond to the left eye and the right eye, respectively, the user can recognize the first display 710*a* and the second display 710*b* as being superimposed. The images corresponding to the left eye and the right eye can be reference to as a "left-eye image" and a "right-eye image", respectively.

In addition, (b) shows the first display 710*a* and the second display 710*b* in which a second frame is displayed. The second lines (BL2) can be displayed on the first display 710*a* and the first lines (BL1) can be displayed on the second display 710*b* in the second frame.

In addition, (c) shows the first display 710*a* and the second display 710*b* in which a third frame is displayed. The first lines (BL1) can be displayed again on the first display 710*a* and the second lines (BL2) can be displayed again on the second display 710*b* in the third frame.

Since the first display 710*a* and the second display 710*b* are simultaneously recognized through both eyes, and since the first lines (BL1) and the second lines (BL2) are disposed at different positions for each frame, the user can not perceive the first lines and the second lines. Therefore, power consumption can be reduced by displaying, on the first display and the second display, the first lines (BL1) and the second lines (BL2) alternating for each frame.

The first lines (BL1) and the second lines (BL2) can be a plurality of pixel rows, each of which extends laterally. Although the first lines (BL1) are illustrated as four lines and the second lines (BL2) are illustrated as three lines, this is only an example, and they are not limited thereto. In addition, the number of the first lines (BL1) and the number of the second lines (BL2) can be the same.

The lines disposed in the first display 710*a* in the first frame and the lines disposed in the second display 710*b* in the second frame can be regarded as the same lines because they include the same position information while being displayed on the first display 710*a* or the second display 710*b*, and thus can be referred to as "first lines". This can also be applied to the second lines (BL2) displayed on the first display 710*a* in the second frame.

It can be seen that the first lines are displayed on the first display 710*a* and the second lines are displayed on the second display 710*b* in the first and third frames, the first lines (BL1) are displayed on the second display 710*b* in the second frame, and the second lines are displayed on the first display in the first and third frames. Therefore, the first time can correspond to a period in which odd-numbered frames are displayed, among a plurality of frames of the image, and the second time can correspond to a period in which even-numbered frames are displayed.

That is, the first display 710*a* can include N first pixel row blocks (where N is a natural number equal to or greater than 2), and the second display 710*b* can include N second pixel row blocks. During the ith frame time, K first pixel row blocks (where K is a natural number equal to or greater than 1 and less than N), among the N first pixel row blocks, are driven in the first display 710*a*, and K second pixel row blocks, among the N second pixel row blocks, are driven in the second display 710*b*.

In addition, during the (i+1)th frame time, K first pixel row blocks, among (N−K) first pixel row blocks excluding K first pixel row blocks that have been driven during the ith frame time, among the N first pixel row blocks, can be driven in the first display 710*a*, and K second pixel row blocks, among (N−K) second pixel row blocks excluding K second pixel row blocks that have been driven during the ith frame time, among the N second pixel row blocks, can be driven in the second display 710*b*. Therefore, the number of lines for displaying images can be reduced, thereby reducing power consumption.

In one embodiment, the remaining first pixel row blocks, excluding K first pixel row blocks that are driven, among N first pixel row blocks in the first display 710*a* and the second display 710*b*, can display a fake image different from the actual image. The fake image can be a black image. In addition, the fake image can be the first lines (BL1) and the second lines (BL2) displayed on the first display 710*a* and the second display 710*b*.

Here, the first lines and the second lines can be lines that are displayed in black because no light is emitted from the pixels corresponding to the first lines and the second lines due to the input of black data. In addition, the first lines and the second lines can be pixels in which the gate lines are not driven. Thereby, it is possible to reduce power consumption by reducing the number of pixels that emit light.

Figure 8:
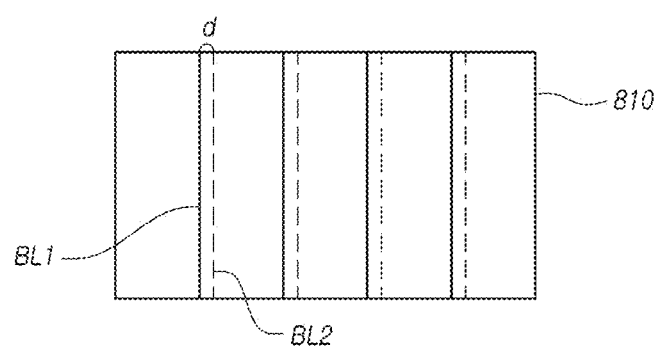
FIG. 8 is a conceptual diagram illustrating a first embodiment in which the first line and the second line are superimposed, the same being displayed on the first display employed in the present embodiments.
Figure 9:
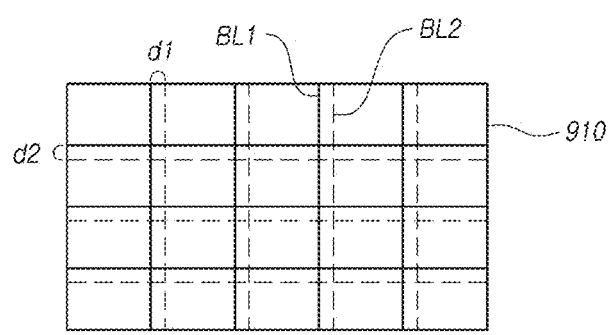
FIG. 9 is a conceptual diagram illustrating a second embodiment in which the first line and the second line are superimposed, the same being displayed on the first display employed in the present embodiments.

FIG. 8 is a conceptual diagram illustrating a first embodiment in which the first lines and the second lines are superimposed, the same being displayed on the first display employed in the present invention, and FIG. 9 is a conceptual diagram illustrating a second embodiment in which the first lines and the second lines are superimposed, the same being displayed on the first display employed in the present invention.

Referring to FIG. 8, the first lines (BL1) and the second lines (BL2) displayed on a first display 810 can be configured as a plurality of lines, each extending in the vertical direction. The first display 810 can display the first lines (BL1) at a first time and the second lines (BL2) at a second time. The first lines (BL1) and the second lines (BL2) can be disposed to be spaced a predetermined distance (d) apart from each other.

Referring to FIG. 9, the first lines (BL1) displayed at the first time and the second lines (BL2) displayed at the second time on the first display 910 can be arranged in a lattice form. The first lines (BL1) and the second lines (BL2) can be disposed such that the vertical lines are spaced a first distance (d1) apart from each other and the horizontal lines are spaced a second distance (d2) apart from each other.

In FIGS. 8 and 9, the second lines (BL2) are shown as dotted lines to facilitate the distinction between the first lines (BL1) and the first lines (BL2). In addition, the second display shown in FIG. 1 can have the same configuration of lines as the first display 810 or 910. However, the first display 810 or 910 can display the first lines (BL1) at the first time and the second lines (BL2) at the second time, while the second display can display the second lines (BL2) at the first time and the first lines (BL1) at the second time. Although the first lines and the second lines are illustrated as having a uniform distance therebetween on the display, they are not limited thereto. In addition, the first lines and the second lines can be disposed on the edges of the display.

Figure 10:
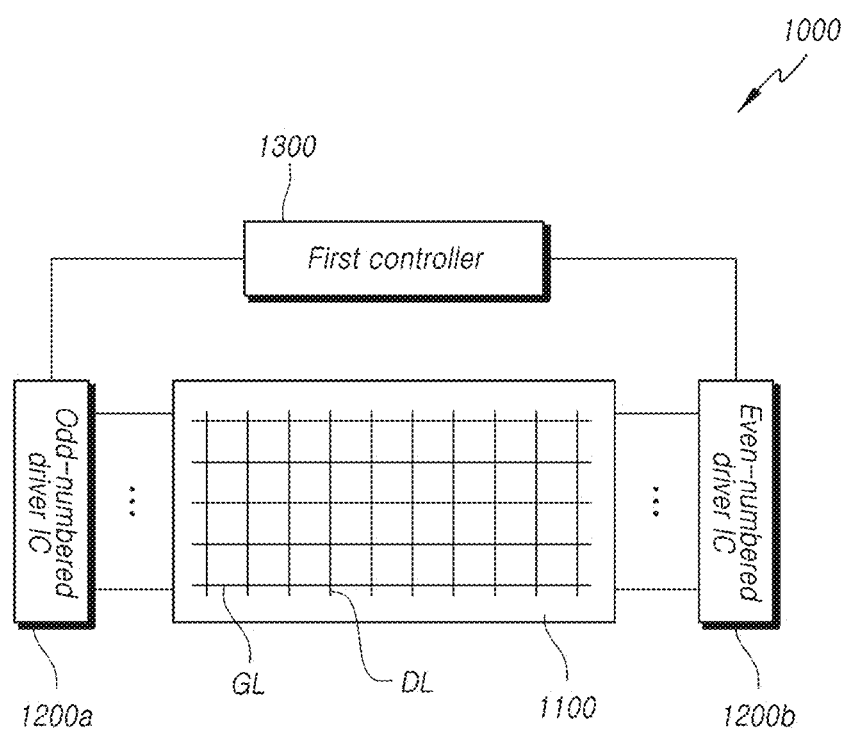
FIG. 10 is a structural diagram illustrating a third embodiment of a display device according to the present invention.

FIG. 10 is a structural diagram illustrating a third embodiment of a display device according to the present invention.

Referring to FIG. 10, only a first display 1100, first driver ICs 1200*a* and 1200*b* for driving the same, and a first controller 1300 of the display device 1000 are shown, while a second display, second driver ICs for driving the same, and a second controller are not shown in the drawing because they can have the same configuration.

The first driver ICs 1200*a* and 1200*b* of the display device 1000, which can apply driving signals to the first display 1100, can include an odd-numbered driver IC 1200*a* for applying driving signals to odd-numbered columns of the first display 1100 and an even-numbered driver IC 1200*b* for applying driving signals to even-numbered columns of the first display 1100. Although the odd-numbered driver IC 1200*a* and the even-numbered driver IC 1200*b* are illustrated herein as being disposed on the left and right sides of the first display 1100, respectively, they are not limited thereto. The odd-numbered columns of the first display 1100 can represent odd-numbered gate lines, among the plurality of gate lines (GL) of the first display 1100, and the even-numbered columns thereof can represent even-numbered gate lines, among the plurality of gate lines (GL) of the first display 1100. However, the present disclosure is not limited thereto.

Figure 11:
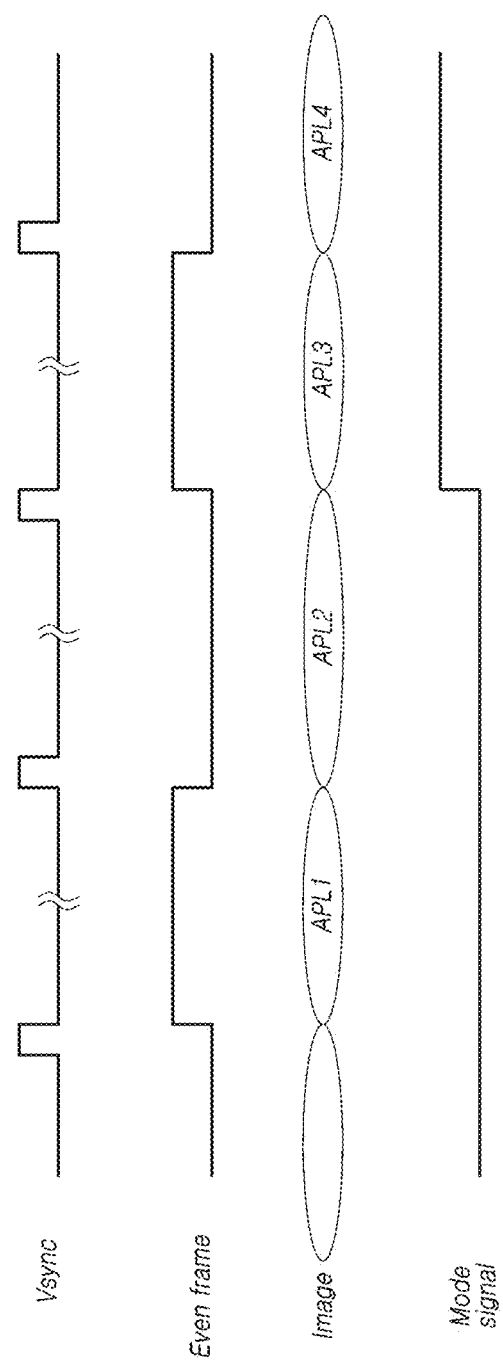
FIG. 11 is a timing chart illustrating waveforms of signals input to the display device shown in FIG. 1.

FIG. 11 is a timing chart illustrating waveforms of signals input to the display device shown in FIG. 1.

Referring to FIG. 11, a vertical synchronization signal (Vsync) can be generated in one frame unit. Even-numbered frame signals, which are high in even-numbered frames, can be generated according to a plurality of vertical synchronization signals (Vsync). If the even-numbered frame signals are in the low state, the frames can correspond to the odd-numbered frames. In addition, an APL for each frame can be calculated using the image signals input to correspond to the even-numbered frame signals.

A reference APL can be output using the calculated APL. If the reference APL is equal to or greater than a predetermined value, the first controller 130*a* and the second controller 130*b* can perform the second driving mode by allowing a mode selection signal to be in a high state. Accordingly, when the average brightness is high and the power consumption is large, the second driving mode can be selected to reduce the power consumption, and when the average brightness is low, the first driving mode can be selected.

Figure 12:
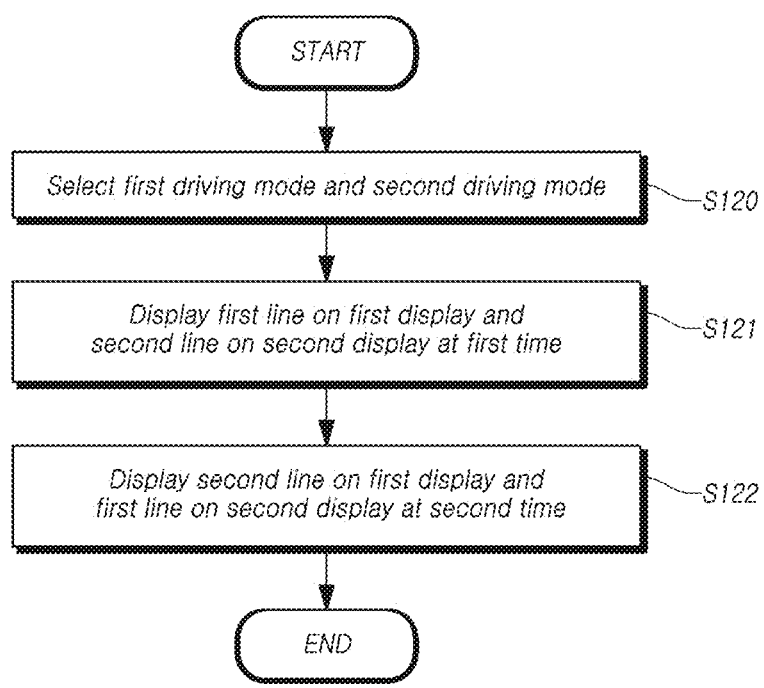
FIG. 12 is a flowchart illustrating an embodiment of a control method of the display device shown in FIG. 1.

FIG. 12 is a flowchart illustrating an embodiment of a control method of the display device shown in FIG. 1.

Referring to FIG. 12, first, one of the first driving mode and the second driving mode can be selected (S120). According to the first driving mode, the first display and the second display of the display device shown in FIG. 1 can operate in the normal mode, and according to the second driving mode, the first display and the second display can operate in the driving mode in which the lines are displayed at different positions. Here, the first driving mode and the second driving mode can be selectively performed. That is, the display device can operate only in the second driving mode.

The second driving mode can be selected so that the first lines can be displayed on the first display and so that the second lines can be displayed to be spaced a predetermined distance apart from the positions, at which the first lines are displayed, on the second display at a first time (S121). Since the lines are displayed on the first display and the second display, power consumption can be reduced.

The first lines and the second lines can be disposed in the form of a plurality of horizontal lines, a plurality of vertical lines, or a lattice on the first display and the second display as shown in FIGS. 7 to 9. The number of first lines can be the same as, or different from, the number of second lines. However, if the first display and the second display are superimposed, the second lines can be disposed at positions spaced a predetermined distance apart from the first lines.

Thus, since the first display and the second display correspond to the two eyes of the user, respectively, the user can simultaneously recognize the images displayed on the first display and the second display, so that the user can not perceive the first lines and the second lines.

The second lines can be displayed on the first display and the first lines can be displayed on the second display at the second time (S122). Since the lines are displayed on the first display and the second display, power consumption can be reduced.

The first time can be a period corresponding to odd-numbered frames and the second time can be a period corresponding to even-numbered frames, among a plurality of frames of an image.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A display device comprising:
   a first display configured to display a first line at a first time and configured to display a second line at a second time at a position spaced a predetermined distance apart from the position at which the first line is displayed;
   a second display configured to display the second line at the first time and configured to display the first line at the second time;
   a first driver IC configured to drive the first display;
   a second driver IC configured to drive the second display; and
   a controller configured to transmit, to the first driver IC, information on the first line at the first time and information on the second line at the second time and configured to supply, to the second driver IC, information on the second line at the first time and information on the first line at the second time.

2. The display device of claim 1, wherein the controller comprises an average picture level (APL) calculator configured to calculate an APL of an image signal transmitted to at least one of the first display and the second display, and
   wherein, if the APL calculated by the APL calculator is equal to or greater than a predetermined value, the first line is displayed on the first display at the first time and the second line is displayed on the second display at the second time.

3. The display device of claim 2, wherein the APL is an average APL of two or more of a plurality of frames.

4. The display device of claim 1, wherein the controller is configured to control the first driver IC and the second driver IC such that black data is supplied to the pixels corresponding to the first line and the second line.

5. The display device of claim 1, wherein the controller is configured to perform control such that the first driver IC and the second driver IC do not supply gate signals to gate lines corresponding to the first line and the second line.

6. The display device of claim 1, wherein the controller comprises a first controller configured to control the first driver IC and a second controller configured to control the second driver IC, and
   wherein the first controller and the second controller operate by receiving a synchronization signal, respectively.

7. The display device of claim 1, wherein the first display and the first driver IC are disposed on a first silicon substrate, and
   wherein the second display and the second driver IC are disposed on a second silicon substrate.

8. The display device of claim 1, wherein the first display is configured to display a left-eye image and the second display is configured to display a right-eye image.

9. The display device of claim 1, wherein the controller is configured to perform control such that the first display and the second display select one of either a first driving mode or a second driving mode to operate, and
   wherein when the second driving mode is selected, the first line is displayed on the first display and the second line is displayed on the second display at the first time, and the second line is displayed on the first display and the first line is displayed on the second display at the second time.

10. A display device comprising:
    a first display including N first pixel row blocks, where N is a natural number equal to or greater than 2;
    a second display including N second pixel row blocks;
    a first driver IC configured to drive the first display; and
    a second driver IC configured to drive the second display,
    wherein, during an $i^{th}$ frame time, K first pixel row blocks, among the N first pixel row blocks, are driven in the first display where K is a natural number equal to or greater than 1 and less than N, and K second pixel row blocks, among the N second pixel row blocks, are driven in the second display, and
    wherein, during an $(i+1)^{th}$ frame time, K first pixel row blocks, among (N−K) first pixel row blocks excluding the K first pixel row blocks that have been driven during the $i^{th}$ frame time, among the N first pixel row blocks, are driven in the first display, and K second pixel row blocks, among (N−K) second pixel row blocks excluding the K second pixel row blocks that have been driven during the $i^{th}$ frame time, among the N second pixel row blocks, are driven in the second display.

11. The display device of claim 10, wherein, during the $i^{th}$ frame time, the remaining first pixel row blocks, excluding the K first pixel row blocks that are driven, among N first pixel row blocks in the first display, display a fake image different from an actual image, and the remaining second pixel row blocks, excluding the K second pixel row blocks that are driven, among N second pixel row blocks in the second display, display the fake image.

12. The display device of claim 11, wherein the fake image is a black image.

13. A controller for controlling a first display corresponding to a left eye of a user and a second display corresponding to a right eye of a user, the controller comprising:
    an operator configured to transmit, to a first driver IC for driving the first display, information on a first line at a first time and information on a second line, spaced a predetermined distance apart from the first line, at a second time, and configured to transmit, to a second driver IC for driving the second display, information on the second line at the first time and information on the first line at the second time; and a memory configured to store the information on the first line and the information on the second line.

14. The controller of claim 13, further comprising:

an average picture level (APL) calculator configured to output a reference APL and configured to calculate an APL corresponding to an image signal output from the operator.

15. The controller of claim 14, wherein the reference APL is either an APL corresponding to one frame or an average APL of two or more frames.

16. The controller of claim 13, wherein when the first display and the second display operate in a second driving mode among a first driving mode and the second driving mode, the operator is configured to supply black data to pixels corresponding to first position information and second position information in the second driving mode.

17. The controller of claim 13, wherein when the first display and the second display operate in a second driving mode among a first driving mode and the second driving mode, the operator is configured to output a control signal such that a gate signal is not transmitted to the pixels corresponding to first position information and second position information in the second driving mode.

18. A method for controlling a display device including a first display and a second display, the method comprising:

displaying a first line on the first display and displaying a second line at a position spaced a predetermined distance apart from the position at which the first line is displayed on the second display at a first time; and displaying the second line on the first display and displaying the first line on the second display at a second time.

19. The method of claim 18, further comprising:

selecting a first driving mode in which the first line and the second line are not displayed on the first display and the second display and a second driving mode in which the first line and the second line are displayed on the first display and the second display, wherein the second driving mode is selected if a reference average picture level (APL) of an image signal input to at least one of the first display and the second display is equal to or greater than a predetermined value.

20. The method of claim 19, wherein the reference APL is an average APL of two or more of a plurality of frames.

* * * * *